(12) United States Patent
Chiu et al.

(10) Patent No.: US 9,633,920 B2
(45) Date of Patent: Apr. 25, 2017

(54) LOW DAMAGE PASSIVATION LAYER FOR III-V BASED DEVICES

(71) Applicant: Taiwan Semiconductor Manufacturing Co., Ltd., Hsin-Chu (TW)

(72) Inventors: Han-Chin Chiu, Kaohsiung (TW); Cheng-Yuan Tsai, Chu-Pei (TW); Ming-Wei Tsai, Zhudong Township (TW); Yao-Wen Chang, Taipei (TW); Wen-Yuan Hsieh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/620,428

(22) Filed: Feb. 12, 2015

(65) Prior Publication Data

US 2016/0240646 A1    Aug. 18, 2016

(51) Int. Cl.
*H01L 23/29* (2006.01)
*H01L 29/66* (2006.01)
*H01L 23/31* (2006.01)
*H01L 29/778* (2006.01)
*H01L 29/10* (2006.01)
*H01L 29/20* (2006.01)

(52) U.S. Cl.
CPC ........ *H01L 23/291* (2013.01); *H01L 23/3171* (2013.01); *H01L 23/3192* (2013.01); *H01L 29/66431* (2013.01); *H01L 29/66462* (2013.01); *H01L 29/66522* (2013.01); *H01L 29/7786* (2013.01); *H01L 29/7787* (2013.01); *H01L 29/1066* (2013.01); *H01L 29/2003* (2013.01)

(58) Field of Classification Search
None
See application file for complete search history.

(56) References Cited

U.S. PATENT DOCUMENTS

| 7,622,322 | B2  |  11/2009 | Schaff et al. | |
| 8,384,129 | B2* | 2/2013 | Kub | H01L 29/0847 257/194 |
| 8,946,778 | B2* | 2/2015 | Briere | H01L 29/0688 257/194 |
| 2013/0134482 | A1* | 5/2013 | Yu | H01L 29/402 257/194 |

(Continued)

*Primary Examiner* — Phat X Cao
*Assistant Examiner* — Diana C Vieira
(74) *Attorney, Agent, or Firm* — Eschweiler & Potashnik, LLC

(57) ABSTRACT

The present disclosure relates to a structure and method of forming a low damage passivation layer for III-V HEMT devices. In some embodiments, the structure has a bulk buffer layer disposed over a substrate and a device layer of III-V material disposed over the bulk buffer layer. A source region, a drain region and a gate region are disposed above the device layer. The gate region comprises a gate electrode overlying a gate separation layer. A bulk passivation layer is arranged over the device layer, and an interfacial layer of III-V material is disposed between the bulk passivation layer and the device layer in such a way that the source region, the drain region and the gate region extend through the bulk passivation layer and the interfacial layer, to abut the device layer.

17 Claims, 11 Drawing Sheets

(56) References Cited

U.S. PATENT DOCUMENTS

| | | | |
|---|---|---|---|
| 2013/0306978 A1* | 11/2013 | Chen | H01L 21/02381 |
| | | | 257/76 |
| 2013/0341678 A1 | 12/2013 | Green et al. | |
| 2014/0231816 A1 | 8/2014 | Chiu et al. | |
| 2015/0311084 A1* | 10/2015 | Moore | H01L 21/28587 |
| | | | 257/280 |
| 2015/0349117 A1* | 12/2015 | Chu | H01L 29/7827 |
| | | | 257/66 |

\* cited by examiner

LOW DAMAGE PASSIVATION LAYER FOR III-V BASED DEVICES

BACKGROUND

High-electron-mobility transistors (HEMTs), also known as heterostructure FETs (HFETs) or modulation-doped FETs (MODFETs), are field-effect transistors incorporating a junction between two materials with different band gaps (i.e. a heterojunction) as the channel instead of a doped region (as is generally the case for MOSFETs). III-N (tri nitride) devices, such as AlGaN/GaN devices, are one type of HEMT that show very promising performance in high-power and high-frequency applications. III-N devices can be used, for example, in high power-high frequency applications such as emitters for cell phone base stations, Direct Broadcast Satellite (DBS) receivers, electronic warfare systems, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
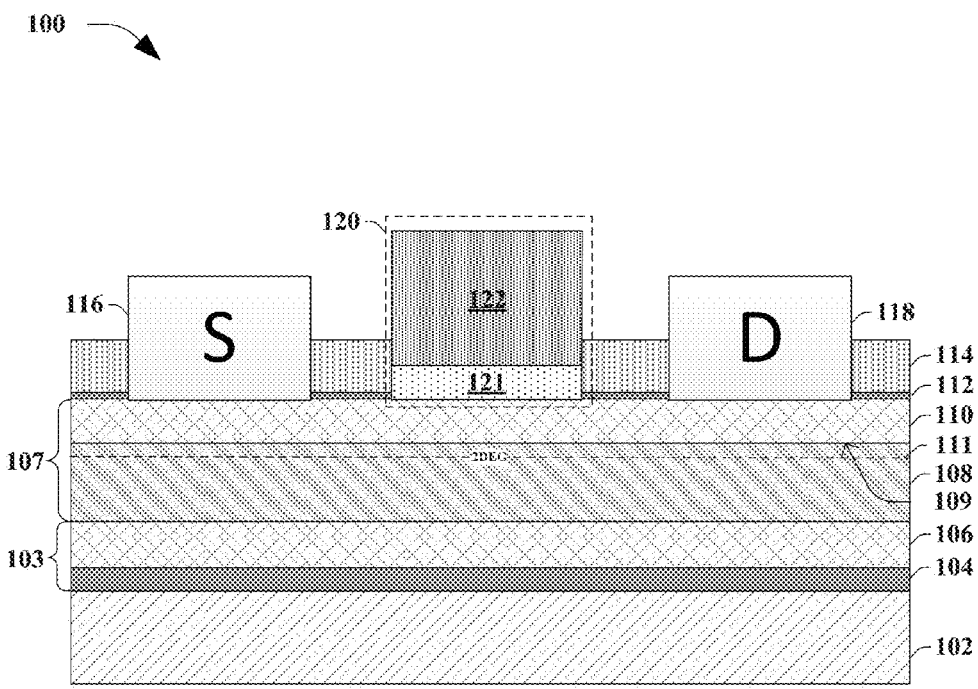
FIG. 1 illustrates a cross-sectional view of a III-V HEMT device having an interfacial layer between a device layer and a bulk passivation layer, according to some embodiments of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures "first", "second", "third", etc. are not intended to be descriptive of the corresponding element. Therefore, "a first dielectric layer" described in connection with a first figure may not necessarily corresponding to a "first dielectric layer" described in connection with another figure.

A HEMT device uses a heterojunction between two materials with different band gaps as a channel region. Ideally, the two different materials used for the heterojunction would have the same or slightly different lattice constant (spacing between atoms). In practice, however, the lattice constants are typically slightly different. The difference in the lattice constants of these materials, such as AlGaN and GaN, produces a strain that can result in band distortion of band diagram in certain conditions. This band diagram distortion can result in accumulation of electrons (2 dimensional electron gas, 2DEG) at the interface of two different materials. This 2DEG will be deeply affected by top surface defects, such as native oxide, dangling bonds, and pits. These trap states trap electrons injected by a gate and create a layer of charge at or near the top surface of the heterojunction, which depletes the channel region in a high field region between the gate and drain. In general, to have a transistor device fabrication complete, a surface passivation layer was deposited on the top surface of the heterojunction to regulate device turn on/off. Thus, the interface traps between the passivation layer and a III-N material will affect the device performance.

The number of interface trap states may be limited (and thereby device performance improved) by forming bulk passivation layers such as SiOx (silicon oxide) and SiNx (silicon nitride) directly over a top surface of the III-V heterojunction structure. However, SiOx and SiNx passivation layers as such, will degrade the III-V device performance due to impurity diffusion and electron trapping. For example, with respect to oxide passivation layers, a high quality oxide passivation layer is necessary to achieve a high performance and highly reliable III-V device. However, a high quality SiOx can be grown by high thermal processes (low-pressure chemical vapor deposition) or plasma-assisted deposition (such as, a plasma enhanced chemical vapor deposition (PECVD) process), which will induce O (oxygen) diffusion into a III-V device layer and degrade device performance. On the other hand, a SiNx passivation layer usually acts as a trap layer that traps electrons from the channel region. This will degrade the device performance by reducing the mobility of carriers and increasing dynamic on-resistance ($R_{ON}$) corresponding to device switching ON/OFF. Furthermore, most of the HEMT devices that include a plasma enhanced chemical vapor deposited SiNx (PESN) passivation layer degrade quickly, as they cannot survive the plasma induced damage during the growth of the PESN layer.

In view of the foregoing, the present disclosure relates to a structure and method for forming a low damage passivation layer over a III-V HEMT device by introducing an interfacial layer between the bulk passivation layer and the device layer. In some embodiments, the structure comprises a bulk buffer layer disposed over a substrate and a device layer of III-V material disposed over the bulk buffer layer. A source region, a drain region and a gate region (which is located laterally between the source and the drain regions), are disposed above the device layer. The gate region comprises a gate electrode overlying a gate separation layer. A bulk passivation layer is arranged over the device layer, and an interfacial layer of III-V material is disposed between the bulk passivation layer and the device layer. The source region, the drain region and the gate region extend through the bulk passivation layer and the interfacial layer, to abut the device layer. The interfacial layer will help prevent impurity diffusion, provide better lattice matching and provide protection to the bulk passivation layer, thus helping in forming a high quality bulk passivation layer that causes very less damage to the device layer.

FIG. 1 illustrates a cross-sectional view of a III-V HEMT device 100 having an interfacial layer between a device layer and a bulk passivation layer, according to some embodiments of the present disclosure.

The III-V HEMT device 100 comprises a substrate 102, such as a silicon, sapphire, or silicon carbide substrate, for example. A bulk buffer layer 103 resides over the substrate 102, which includes an AlN buffer layer 104, underlying an AlGaN (aluminum gallium nitride) buffer layer 106. In some embodiments, the AlN buffer layer 104 includes multiple AlN seed layers that are arranged in a way, for improving lattice matching, reducing threading dislocations, reducing tensile stress and improving the quality of a III-V device layer (formed over it at a later stage of processing). The AlGaN buffer layer 106 provides additional lattice matching between the AlN buffer layer 104 and a layer formed above the AlGaN buffer layer 106. In some embodiments, the AlGaN buffer layer 106 comprises multiple layers or a single graded layer of a group III-V material that has varying concentrations for group III and group V elements as a function of depth.

A device layer 107 of III-V material resides over the bulk buffer layer 103. The bulk buffer layer 103 is disposed over the substrate 102 to reduce lattice mismatch between the substrate 102 and the device layer 107. The device layer 107 comprises a first III-V device sub-layer 108 having a first bandgap and a second III-V device sub-layer 110 having a second bandgap that differs from the first bandgap. The first and second III-V device sub-layers 108 and 110 abut at a heterojunction interface 109. In some embodiments, the first III-V device sub-layer 108 comprises GaN (gallium nitride) and the second III-V device sub-layer 110 comprises AlGaN. A 2DEG (two-dimensional electron gas) channel 111 is formed near the interface 109.

An interfacial layer 112 of III-V material is disposed over the device layer 107, and a bulk passivation layer 114 is disposed directly above the interfacial layer 112. In some embodiments, the interfacial layer 112 comprises AlN, boron nitride (BN) or an aluminum boron nitrogen alloy (AlxBl-xN), where x ranges from approximately 0.25 to approximately 0.75. In some embodiments, the bulk passivation layer 114 comprises silicon oxide (SiOx), silicon oxynitride (SiONx), or aluminum oxide (Al2O3), where x ranges from approximately 1.6 to approximately 2.1. The interfacial layer 112 acts as a protective layer that prevents diffusion of oxygen (O) atoms and damage to the device layer 107 due to a plasma enhanced growth process, ensuring high productivity and good thickness uniformity for the bulk passivation layer 114. The interfacial layer 112 further provides better lattice matching between the bulk passivation layer 114 and the device layer 107, which ensures better structural quality for the bulk passivation layer 114. These qualities of the interfacial layer 112 will help in forming a low damage bulk passivation layer over the III-V HEMT device. A low damage bulk passivation layer can further solve any threshold voltage ($V_{th}$) non-uniformity issues associated within a wafer that contains the device, thereby improving a total yield of a wafer.

A source region 116 and a drain region 118 are disposed over an upper surface of the device layer 107 and are arranged at two end locations of the second III-V device sub-layer 110 of the III-V HEMT device 100. In some embodiments, the source and drain regions, 116 and 118, can extend deeper in to the second III-V device sub-layer 110 and reside at some level within the height of the second III-V device sub-layer 110 or extend further in to the 2DEG channel 111 between the first III-V device sub-layer 108 and second III-V device sub-layer 110. A gate region 120 resides over the device layer 107 between the source region 116 and the drain 118 region. The gate region 120 comprises, a gate separation layer 121 and a gate electrode 122 disposed above the gate separation layer 121. The source region 116, the drain region 118 and the gate region 120 are disposed in such a way that they extend through the interfacial layer 112 and the bulk passivation layer 114, to abut a top surface of the second III-V device sub-layer 110. In some embodiments, the gate separation layer 121 comprises an insulator or a doped III-V material layer. In some embodiments, the source region 116, the drain region 118 and the gate electrode 122 comprise metals like Ti/Al/Ni/Au.

During operation, a voltage applied to the gate electrode 122 controls the flow of carriers (e.g., electrons) from the source region 116 to the drain region 118 through a channel region (2DEG) 111 in the device layer 107. In other words, the III-V HEMT device 100 can be controlled by controlling the 2DEG channel 111 with the help of the gate electrode 122.

Figure 2:
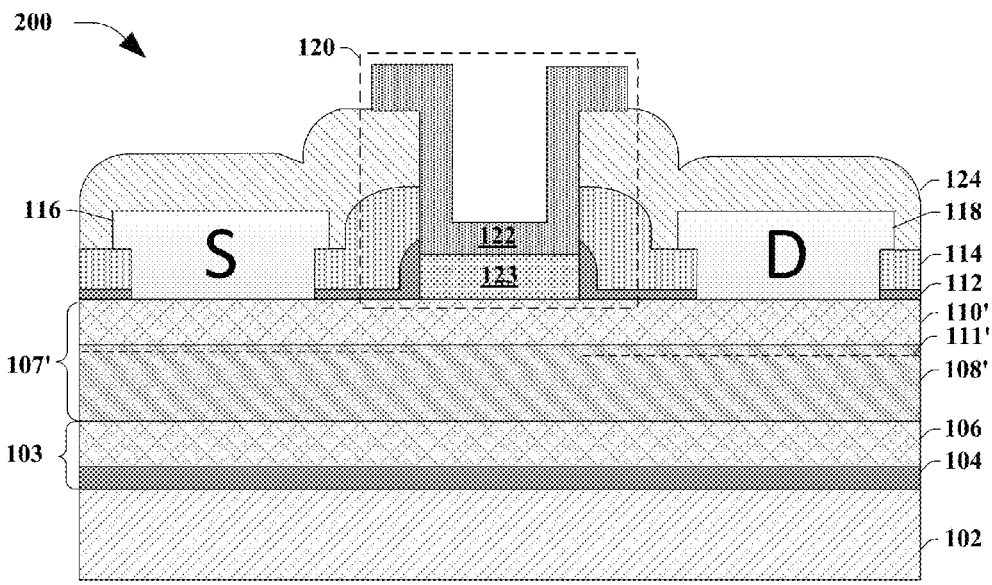
FIG. 2 illustrates a cross-sectional view of an enhancement mode III-N HEMT device having an interfacial layer, formed according to some embodiments of the present disclosure.
Figure 3:
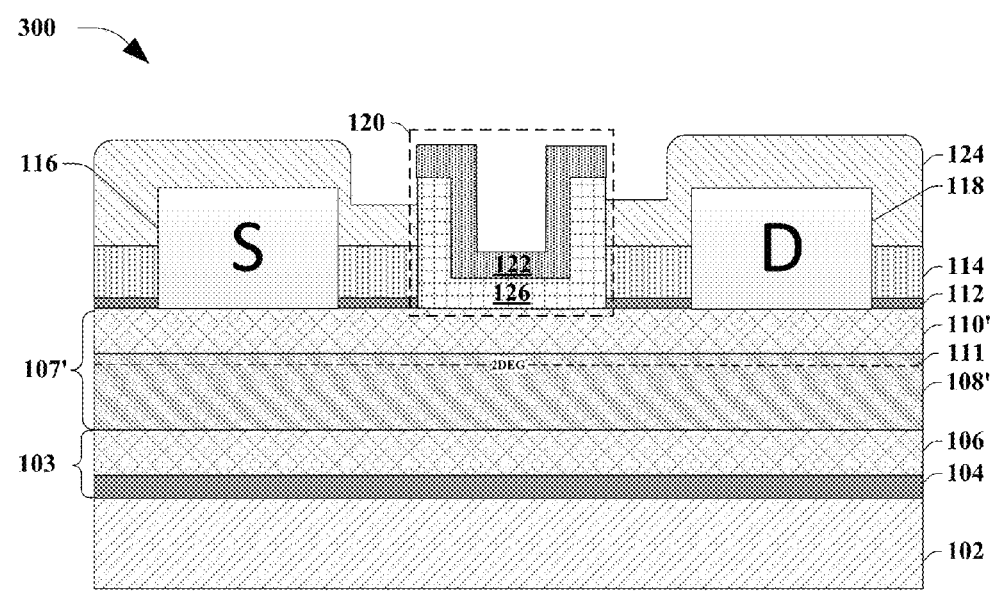
FIG. 3 illustrates a cross-sectional view of a depletion mode III-N (MIS-HEMT) (metal insulator semiconductor HEMT) device having an interfacial layer, formed according to some embodiments of the present disclosure.

FIGS. 2 and 3, illustrate some exemplary embodiments of an enhancement mode (E-mode) HEMT device and a depletion mode (D-mode) HEMT device, respectively.

FIG. 2 illustrates some embodiments of a cross sectional view of an E-mode III-N HEMT device 200 with an interfacial layer 112, according to the present disclosure. The E-mode III-N HEMT device 200 is normally in a non-conducting state (normally off).

E-mode III-N HEMT device 200 includes a heterojunction structure 107', which is an example of the device layer 107, and comprises a III-V channel layer 108' and a barrier layer 110', arranged on top of the AlGaN buffer layer 106. The III-V channel layer 108' has a first bandgap and the barrier layer 110' has a second, different bandgap. In some embodiments, the barrier layer 110' of E-mode HEMT device 200 comprises a stacked layer, having multiple layers comprising materials such as AlN\Al$_{0.25}$GaN\p-GaN or AlN\Al$_{0.25}$GaN\p-GaN\n-GaN.

A doped III-V material layer 123 separates the gate electrode 122 from the barrier layer 110'. Outer sidewalls of the doped III-V material layer 123 abut the interfacial layer 112 on opposite sides. In some embodiments, the doped III-V material layer 123 comprises doped GaN, which pulls the electrons from the 2DEG channel 111 or donates positive ions to the 2DEG channel 111 under the gate electrode 122, to form a broken 2DEG channel 111', which makes the III-N HEMT device 200 a normally off or an E-mode III-N HEMT device.

A capping layer 124 is disposed over the source region 116, the drain region 118 and the bulk passivation layer 114. The capping layer 124 protects the E-mode HEMT device 200 from out-diffusion that may occur due to any high temperature processes that may take place after the capping layer 124 has been formed. In some embodiments, the capping layer 124 comprises SiNx or SiOx with a thickness ranging between approximately 5 nm to approximately 100 nm. In this embodiment, the gate electrode 122 is disposed within a recess within the interfacial layer 112, the bulk passivation layer 114 and the capping layer 124, and abuts a top surface of the doped III-V material layer 123.

FIG. 3 illustrates some embodiments of a cross-sectional view of a III-N HEMT device 300 with an interfacial layer 112, according to the present disclosure. The III-N HEMT device 300 corresponds to a D-mode MIS FET (metal-insulator-semiconductor field-effect transistor). In depletion mode (D-mode) devices, the high electron mobility of the 2DEG at the interface of the heterojunction (e.g., AlGaN/GaN layers) permits the III-N device to conduct without the application of a gate potential.

The III-N HEMT device 300 has an insulator 126 that separates the gate electrode 122 from the rest of the device. In various embodiments, the insulator 126 may comprise a silicon nitride (SiN) layer, an aluminum oxide ($AlO_3$ or $Al_2O_3$) layer, a hafnium oxide layer ($HfO_2$), or a silicon dioxide ($SiO_2$) layer. In some embodiment, the gate electrode 122 is disposed within a recess within the insulator 126. In some embodiment, the insulator 126 is disposed within a recess within the interfacial layer 112, the bulk passivation layer 114 and the capping layer 124 and abuts a top surface of the barrier layer 110'.

Figure 4:
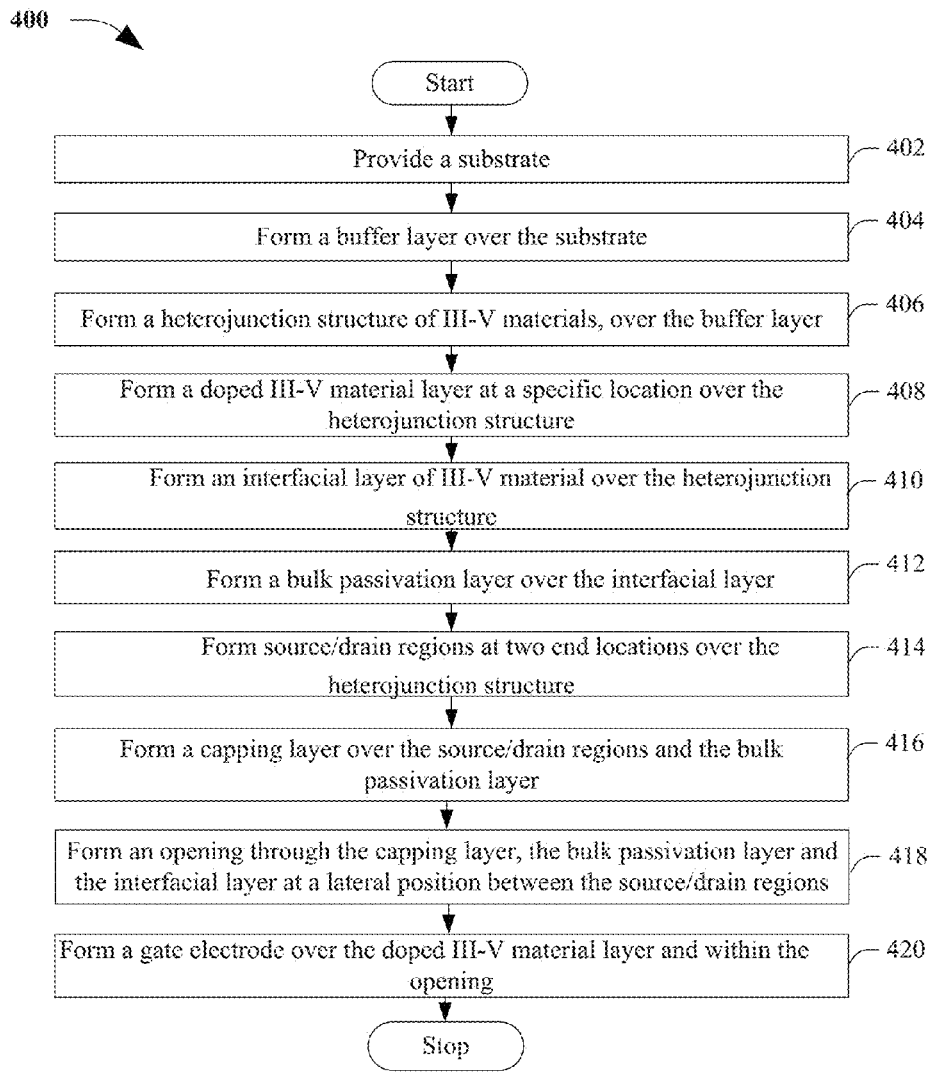
FIG. 4 illustrates a flowchart of some embodiments of a method for manufacturing an enhancement mode III-N HEMT device having an interfacial layer, formed according to some embodiments of the present disclosure.

FIG. 4 illustrates a flowchart of some embodiments of a method 400, for manufacturing an E-mode HEMT device, having an interfacial layer, formed according to some embodiments of the present disclosure.

While the disclosed methods (e.g., 400 and 1400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a substrate is provided.

At 404, a bulk buffer layer is formed over the substrate. In some embodiments, the bulk buffer layer comprises a graded AlGaN buffer layer overlying an AlN buffer layer.

At 406, a heterojunction structure of III-V materials is formed over the bulk buffer layer. In some embodiments, the heterojunction structure comprises AlGaN over GaN. The GaN layer of the heterojunction structure may comprise a doped GaN (UID-GaN) layer, usually referred as unintentionally doped (e.g., a GaN material not having intentionally placed dopants, but rather having a doping resulting from process contaminants, for example). In one embodiment, the UID-GaN layer may have an n-type doping.

At 408, a doped III-V material layer is formed over the heterojunction structure. In some embodiments, the doped III-V material layer comprises n-doped or p-doped GaN.

At 410, an interfacial layer of III-V material is formed over the heterojunction structure.

At 412, a bulk passivation layer is formed over the interfacial layer. In some embodiments, the bulk passivation layer comprises an oxide.

At 414, source and drain regions are formed over the heterojunction structure.

At 416, a capping layer is formed over the source and drain regions and the bulk passivation layer.

At 418, an opening is formed through the capping layer, the bulk passivation layer and the interfacial layer, at a lateral position between the source and drain regions.

At 420, a gate electrode is formed over the doped III-V material layer and within the opening.

FIGS. 5-13 illustrate cross-sectional views of some embodiments of a semiconductor structure at various stages of manufacture, provided to illustrate the method of FIG. 4. Although FIGS. 5-13 are described in relation to the method 400, it will be appreciated that the structures disclosed in FIGS. 5-13 are not limited to the method 400, but instead may stand alone as structures independent of the method 400. Similarly, although the method 400 is described in relation to FIGS. 5-13, it will be appreciated that the method 400 is not limited to the structures disclosed in FIGS. 5-13, but instead may stand alone independent of the structures disclosed in FIGS. 5-13.

Figure 5:
FIGS. 5-13 illustrate cross-sectional views of some embodiments of a semiconductor structure at various stages of manufacture, provided to illustrate the method of FIG. 4A.

FIG. 5 illustrates a cross-sectional view of some embodiments of a semiconductor structure 500 corresponding to Act 402 of FIG. 4. As illustrated in FIG. 5, a substrate 102 is provided. In some embodiments, the substrate 102 can be a Si, SiC (silicon carbide) or sapphire substrate. In some embodiments, the substrate 102 comprises a silicon wafer with its crystalline structure terminating on a (111) lattice plane. In other embodiments, the substrate 102 can be a sapphire wafer, a silicon-carbide wafer, or a silicon-on-insulator (SOI) wafer.

Figure 6:
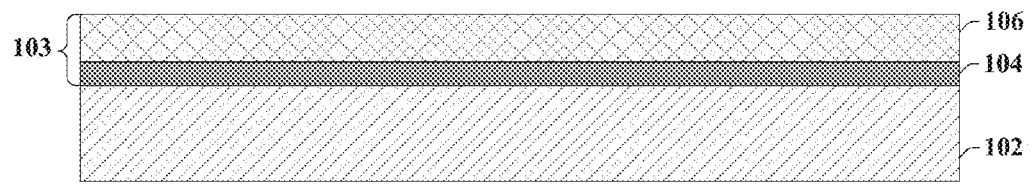

FIG. 6 illustrates a cross-sectional view of a semiconductor structure 600 corresponding to Act 404 of FIG. 4. As illustrated in FIG. 6, a bulk buffer layer 103 is formed over the substrate 102. In some embodiments, the bulk buffer layer 103 comprises an AlN buffer layer 104 and an AlGaN buffer layer 106 overlying the AlN buffer layer 104. In various embodiments, the AlN buffer layer 104 comprises multiple seed layers formed at various temperatures and growth modes. The AlN buffer layer 104 provides good lattice matching between the substrate 102 and the AlGaN buffer layer 106, reduces threading dislocations and reduces tensile stress on the AlGaN buffer layer 106. As mentioned above, the AlGaN buffer layer 106 provides additional lattice matching between the substrate and the III-V device layer formed over it.

In many embodiments, the AlGaN buffer layer 106 is a graded layer that has a chemical formula that varies as a function of depth. For example, the AlGaN buffer layer 106 has a first chemical formula at an interface between the AlGaN buffer layer 106 and the underlying AlN buffer layer 104, and a second chemical formula at an interface between the AlGaN buffer layer 106 and an overlying III-V device layer. In various embodiments, the AlGaN buffer layer 106 may comprise a chemical formula of $AlGa_{1-x}N$, where x is in a range of approximately 0.1 to approximately 0.95 at different positions in the AlGaN buffer layer 106. In some embodiments, the AlGaN buffer layer 106 comprises for example, a 3X—AlGaN layer having a chemical composition of $Al_{0.75}Ga_{0.25}N\backslash Al_{0.5}Ga_{0.5}N\backslash Al_{0.25}Ga_{0.25}N$ or a 4X—AlGaN layer having a chemical composition of $Al_{0.75}Ga_{0.25}N\backslash Al_{0.5}Ga_{0.5}N\backslash Al_{0.25}Ga_{0.25}N\backslash Al_{0.1}Ga_{0.9}N$. The AlGaN buffer layer 106 may be grown at a temperature ranging between approximately 980° C. and approximately 1150° C. to a thickness ranging between approximately 0.2 um and approximately 1.5 um.

Figure 7:
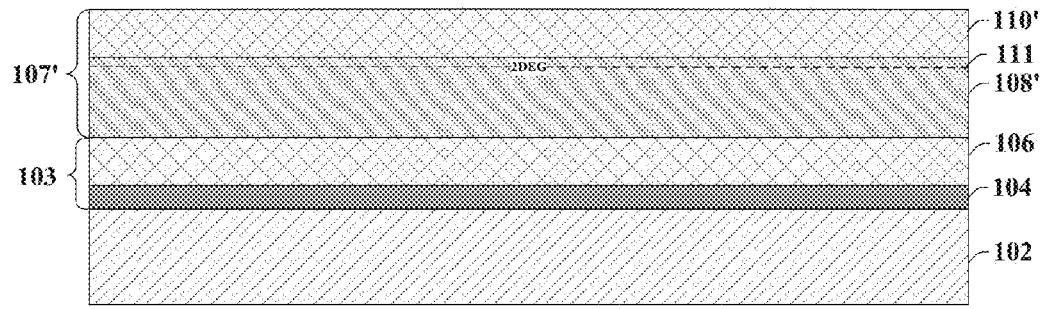

FIG. 7 illustrates a cross-sectional view of a semiconductor structure 700 corresponding to Act 406 of FIG. 4. As illustrated in FIG. 7, a heterojunction structure 107' comprising a III-V channel layer 108' and a barrier layer 110' is disposed over the bulk buffer layer 103. In some embodiments, the III-V channel layer 108' comprises u-GaN (unintentionally doped GaN) having a carbon concentration less than $1e17$ $cm^{-3}$. In some embodiments, the u-GaN thickness ranges between approximately 0.2 um and approximately 1.0 um and it is grown at a temperature ranging between approximately 950° C. and approximately 1050° C. The barrier layer 110' is used to provide the band gap discontinuity with III-V channel layer 108' to form the 2DEG channel 111. In some embodiments, the barrier layer 110' comprises $Al_{0.25}GaN$, or a stacked structure having multiple layers comprising materials such as $AlN\backslash Al_{0.25}GaN\backslash u$-GaN, $AlN\backslash Al_{0.25}GaN\backslash p$-GaN or $AlN\backslash Al_{0.25}GaN\backslash p$-GaN\n-GaN.

Figure 8:
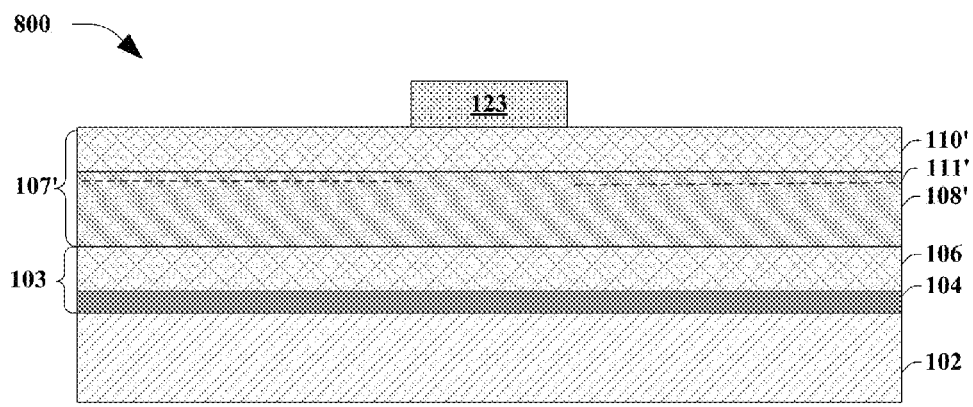

FIG. 8 illustrates a cross-sectional view of a semiconductor structure 800 corresponding to Act 408 of FIG. 4. As illustrated in FIG. 8, a doped III-V material layer 123 is formed at a specific location over the heterojunction structure 107'. Formation of the doped III-V material layer 123 includes the following steps: depositing a III-V material layer, doping the III-V material layer with p-type or n-type dopants, and performing a masked etching step to pattern it to a location over the heterojunction structure 107'. The doped III-V material layer 123 pulls electrons from the 2DEG channel 111' and forms the broken 2DEG channel 111'. In some embodiments, the doped III-V material layer 123 comprises n-GaN or p-GaN.

Figure 9:
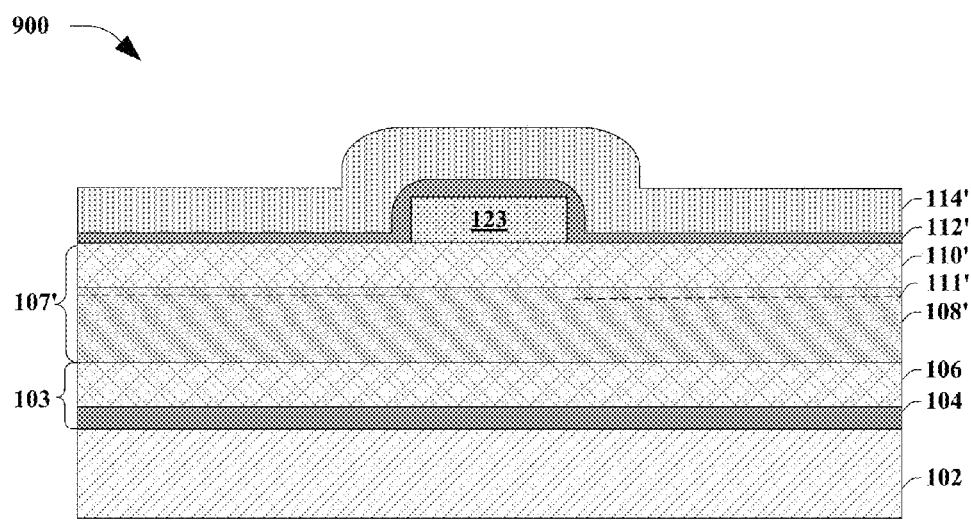

FIG. 9 illustrates a cross-sectional view of a semiconductor structure 900 corresponding to Acts 410 and 412 of FIG. 4. As illustrated in FIG. 9, an interfacial layer material 112' and a bulk passivation layer material 114' are formed over the heterojunction structure 107'. The interfacial layer material 112' envelops the doped III-V material layer 123. In some embodiments, the interfacial layer material 112' comprises AlN, boron nitride (BN) or an aluminum boron nitrogen alloy (AlxB1-xN), where x ranges from approximately 0.25 to approximately 0.75. In some embodiments, the bulk passivation layer material 114' comprises SiOx, silicon oxynitride (SiONx), or aluminum oxide (Al2O3), where x ranges from approximately 1.6 to approximately 2.1. In various embodiments, the interfacial layer material 112' and the bulk passivation layer material 114' are formed by deposition methods such as PECVD, ALD, CVD or PVD. The interfacial layer may be formed to a thickness ranging from approximately 5 Angstroms to approximately 500 Angstroms, while the bulk passivation layer may be formed to a thickness ranging from approximately 30 nm to approximately 500 nm. In some embodiments, a SiOx bulk passivation layer is formed through a PECVD process performed within a processing chamber held at a temperature in a range of between approximately 300° C. and approximately 550° C., over an AlN interfacial layer for producing a high quality and low damage passivation layer.

Figure 10:
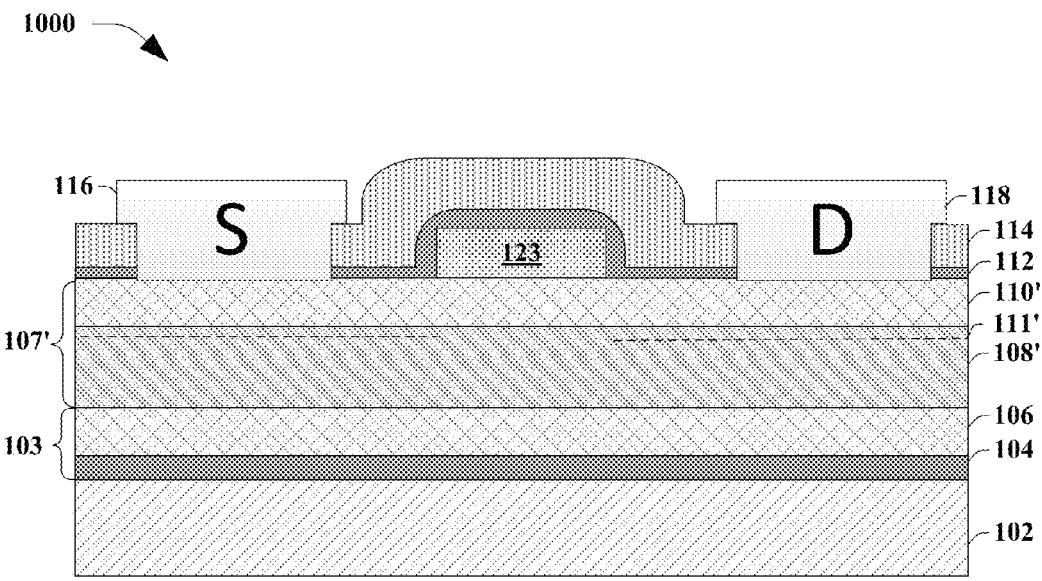

FIG. 10 illustrates a cross-sectional view of a semiconductor structure 1000 corresponding to Act 414 of FIG. 4. As illustrated in FIG. 10, a source region 116 and a drain region 118 are formed at opposing ends of the barrier layer 110'. In some embodiments, the source and drain regions 116 and 118 respectively, can extend deeper in to the barrier layer 110' and reside at some level within the depth of the barrier layer 110' or extend further in to the broken 2DEG channel 111'. In some embodiments, the source and drain regions 116 and 118 respectively, are formed by selectively depositing a metal, by way of a deposition process (e.g., PVD, CVD, etc.), at a position in contact with the heterojunction structure 107' so as to form an ohmic contact with the broken 2DEG channel 111'. Materials of the source region 116 and the drain region 118 are generally annealed after formation. The interfacial layer material 112 and the bulk passivation layer material 114 are removed/etched away, in those areas where the source region 116 and the drain region 118 are formed, before depositing the source and drain metals. In some embodiments, source and drain regions are formed by selectively depositing metals like Ti, Al, Ni, Au or a combination of such metals.

Figure 11:
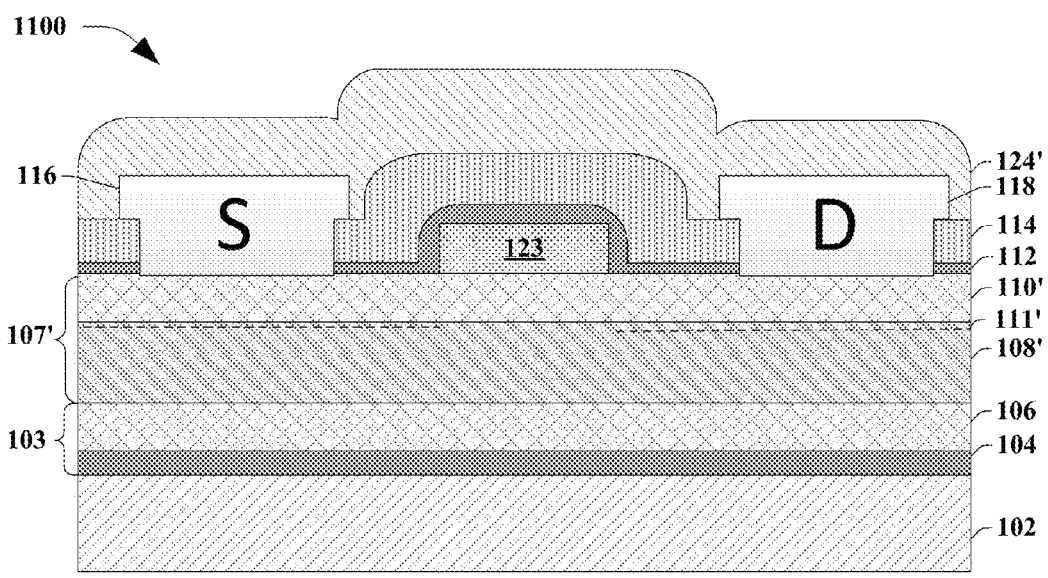

FIG. 11 illustrates a cross-sectional view of a semiconductor structure 1100 corresponding to Act 416 of FIG. 4. As illustrated in FIG. 11, a capping layer material 124' is formed over the bulk passivation layer material 114 and the source and drain regions 116 and 118 respectively. In some embodiments, the capping layer material 124' can be formed by low temperature deposition methods like PECVD, PVD or ALD. In some embodiments, the capping layer material 124' comprises SiNx or SiOx.

Figure 12:
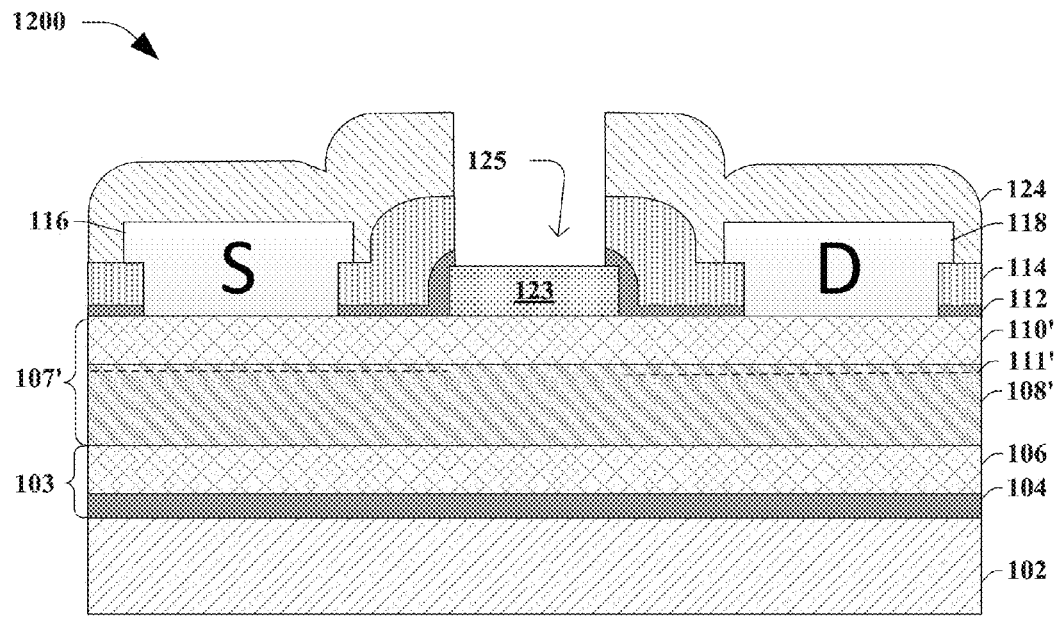

FIG. 12 illustrates a cross-sectional view of a semiconductor structure 1200 corresponding to Act 418 of FIG. 4. As illustrated in FIG. 12, an opening 125 is formed through the capping layer material 124, the bulk passivation layer material 114' and the interfacial layer material 112, at a lateral position between the source and drain regions 116, 118 respectively, to form capping layer 124, interfacial layer 112 and bulk passivation layer 114. In various embodiments, the opening 125 may be formed using a dry etchant (e.g., an RIE etch, a plasma etch, etc.) or a wet etchant (e.g., hydroflouric acid).

Figure 13:
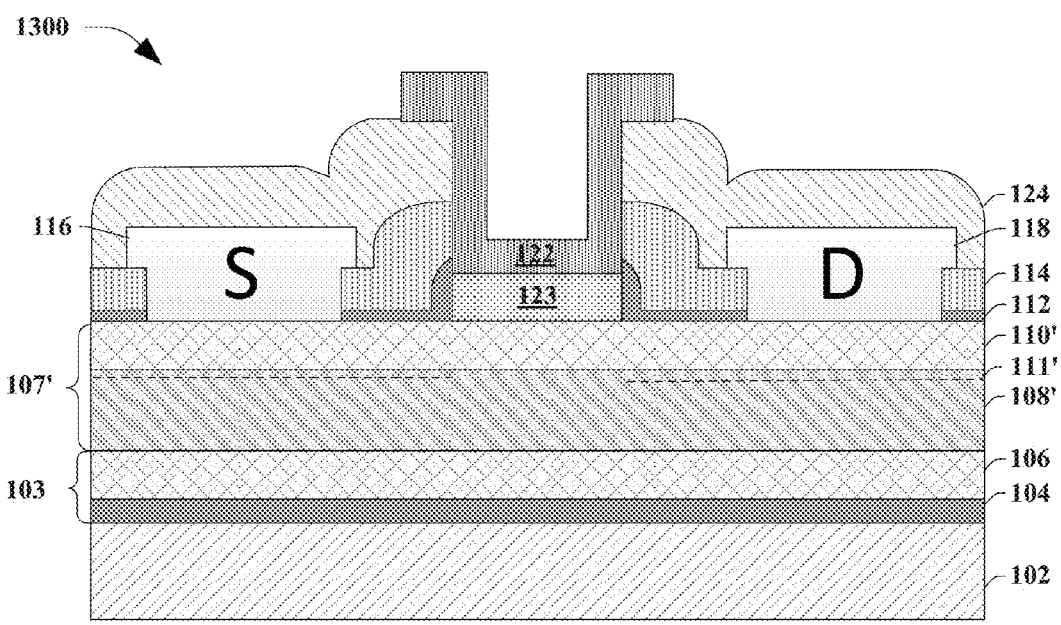

FIG. 13 illustrates a cross-sectional view of a semiconductor structure 1300 corresponding to Act 420 of FIG. 4. As illustrated in FIG. 13, a gate electrode 122 is formed over the doped III-V material layer 123, within the opening 125. The gate electrode 122 is formed in such a way that the interfacial layer 112, the bulk passivation layer 114 and the capping layer 124 abut outer sidewalls of the gate electrode 122. In some embodiments, the gate electrode 122 comprises metals like Ti, Al, Ni, Au or a combination of such metals.

Figure 14:
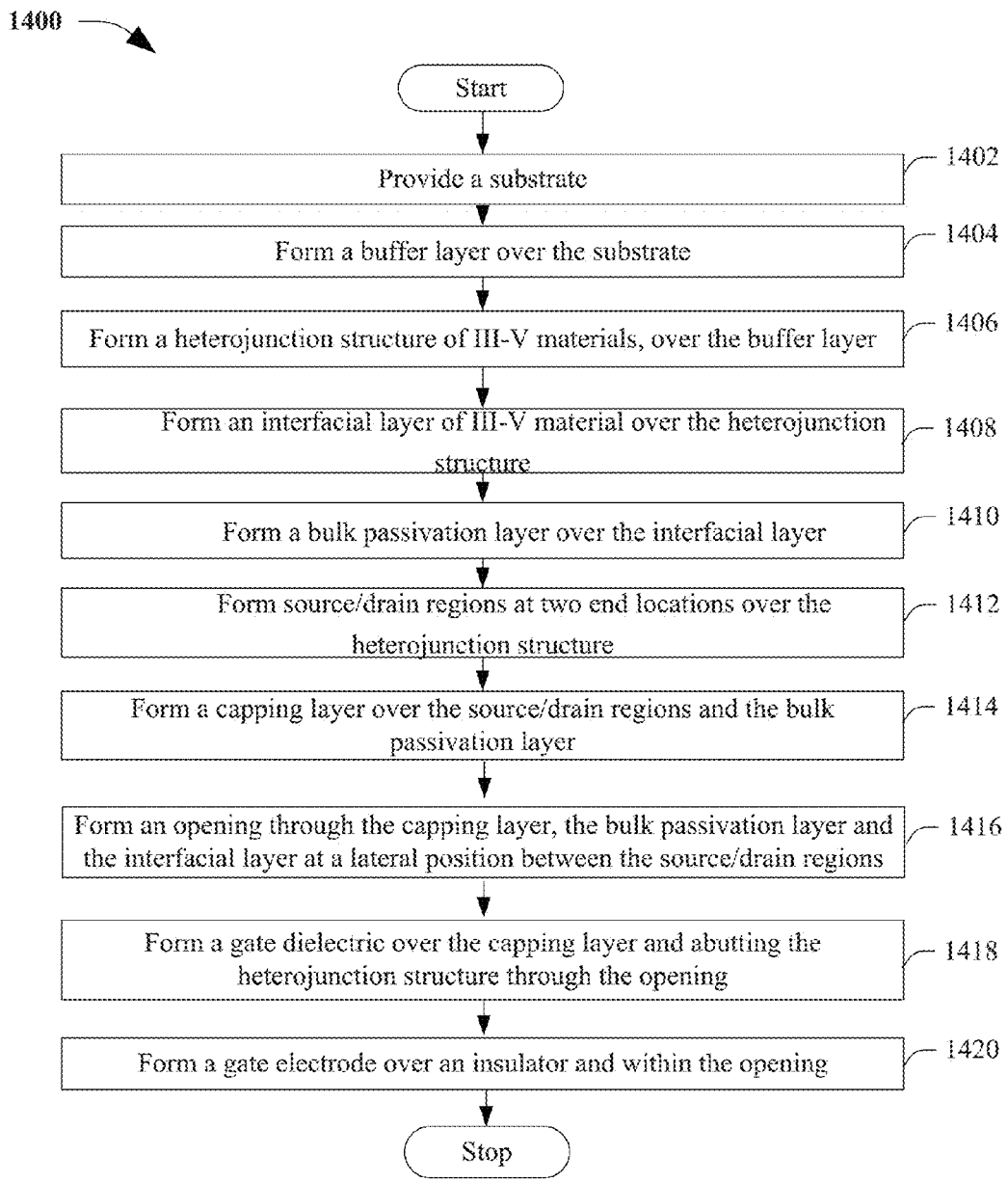
FIG. 14 illustrates a flowchart of some embodiments of a method for manufacturing a depletion mode MIS-HEMT device having an interfacial layer, formed according to some embodiments of the present disclosure.

FIG. 14 illustrates a flowchart of some embodiments of a method 1400, for manufacturing a D-mode MISFET, having an interfacial layer, formed according to some embodiments of the present disclosure.

At 1402, a substrate is provided.

At 1404, a bulk buffer layer is formed over the substrate. In some embodiments, the bulk buffer layer comprises a graded AlGaN buffer layer overlying an AlN buffer layer.

At 1406, a heterojunction structure of III-V materials is formed over the bulk buffer layer.

At 1408, an interfacial layer of III-V material is formed over the heterojunction structure. In some embodiments, the interfacial layer comprises AlN.

At 1410, a bulk passivation layer is formed over the interfacial layer. In some embodiments, the bulk passivation layer comprises an oxide.

At 1412, source and drain regions are formed over the heterojunction structure.

At 1414, a capping layer is formed over the source and drain regions and the bulk passivation layer.

At 1416, an opening is formed through the capping layer, the bulk passivation layer and the interfacial layer, at a lateral position between the source and drain regions.

At 1418, an insulator layer and a gate electrode layer is formed over the capping layer, where the insulator layer abuts the heterojunction structure through the opening.

At 1420, a gate electrode is formed over an insulator.

FIGS. 5-7 and 15-20 illustrate cross-sectional views of some embodiments of a semiconductor structure at various stages of manufacture, provided to illustrate the method of FIG. 14. Although FIGS. 5-7 and 15-20 are described in relation to the method 1400, it will be appreciated that the structures disclosed in FIGS. 5-7 and 15-20 are not limited to the method 1400, but instead may stand alone as structures independent of the method 1400. Similarly, although the method 1400 is described in relation to FIGS. 5-7 and 15-20, it will be appreciated that the method 1400 is not limited to the structures disclosed in FIGS. 5-7 and 15-20, but instead may stand alone independent of the structures disclosed in FIGS. 5-7 and 15-20.

FIGS. 5-7 have already been described above.

Figure 15:
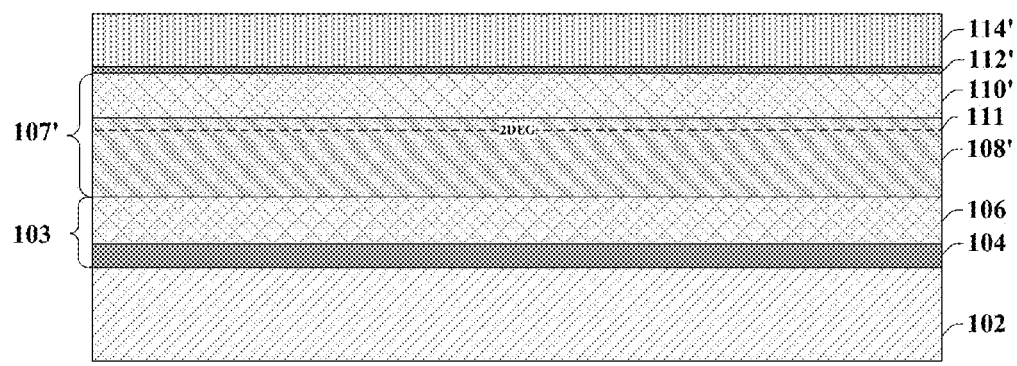
FIGS. 15-20 illustrate cross-sectional views of some embodiments of a semiconductor structure at various stages of manufacture, provided to illustrate the method of FIG. 4B.

FIG. 15 illustrates a cross-sectional view of a semiconductor structure 1500 corresponding to Acts 1408 and 1410 of FIG. 14. As illustrated in FIG. 15, after formation of the heterojunction structure 107' (shown in FIG. 7), an interfacial layer material 112' and a bulk passivation layer material 114' are formed over the heterojunction structure 107'. In some embodiments, the interfacial layer material 112' comprises AlN, boron nitride (BN) or an aluminum boron nitrogen alloy (AlxB1-xN), where x ranges from approximately 0.25 to approximately 0.75. In some embodiments, the bulk passivation layer material 114' comprises SiOx, silicon oxynitride (SiONx), or aluminum oxide (Al2O3), where x ranges from approximately 1.6 to approximately 2.1. In various embodiments, the interfacial layer material 112' and the bulk passivation layer material 114' are formed by deposition methods such as PECVD, ALD, CVD or PVD. In some embodiments, a SiOx bulk passivation layer is formed through a PECVD process at a temperature ranging between approximately 300° C. and approximately 550° C., over an AlN interfacial layer for producing a high quality and low damage passivation layer.

Figure 16:
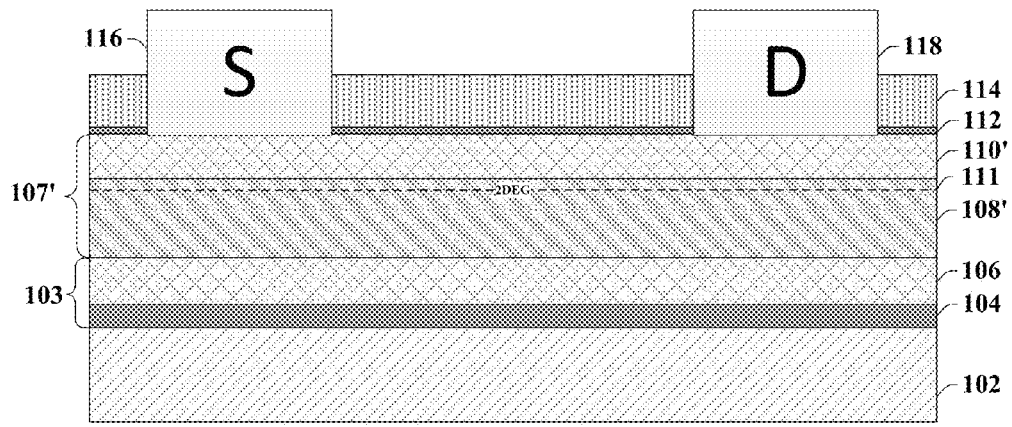

FIG. 16 illustrates a cross-sectional view of a semiconductor structure 1600 corresponding to Act 1412 of FIG. 14. As illustrated in FIG. 16, a source region 116 and a drain region 118 are formed at opposing ends of the barrier layer 110'. In some embodiments, the source and drain regions 116 and 118 respectively, can extend deeper in to the barrier layer 110' and reside at some level within the depth of the barrier layer 110' or extend further in to the 2DEG 111. In some embodiments, the source and drain regions 116 and 118 respectively, are formed by selectively depositing a metal, by way of a deposition process (e.g., PVD, CVD, etc.), at a position in contact with the heterojunction structure 107' so as to form an ohmic contact with the 2DEG 111. Materials of the source region 116 and the drain region 118 are generally annealed after formation. The interfacial layer material 112 and the bulk passivation layer material 114 must be removed/etched away, in those areas where the source region 116 and the drain region 118 are formed, before depositing the source and drain metals. In some embodiments, source and drain regions are formed by selectively depositing metals like Ti, Al, Ni, Au or a combination of such metals.

Figure 17:
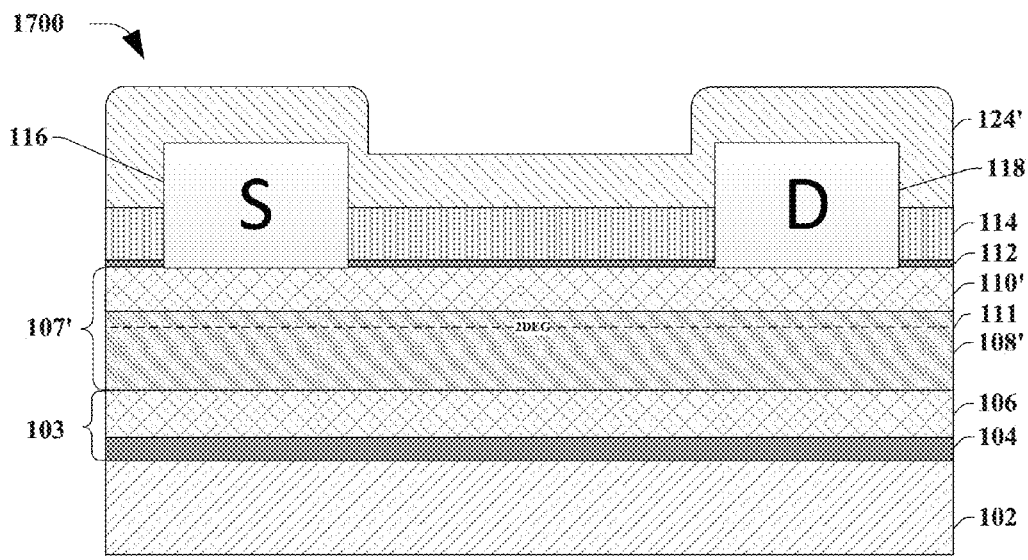

FIG. 17 illustrates a cross-sectional view of a semiconductor structure 1700 corresponding to Act 1414 of FIG. 14. As illustrated in FIG. 17, a capping layer material 124' is formed over the bulk passivation layer material 114 and the source and drain regions 116 and 118 respectively. In some embodiments, the capping layer material 124' can be formed by low temperature deposition methods like PECVD, PVD or ALD. In some embodiments, the capping layer 124' comprises SiNx or SiOx.

Figure 18:
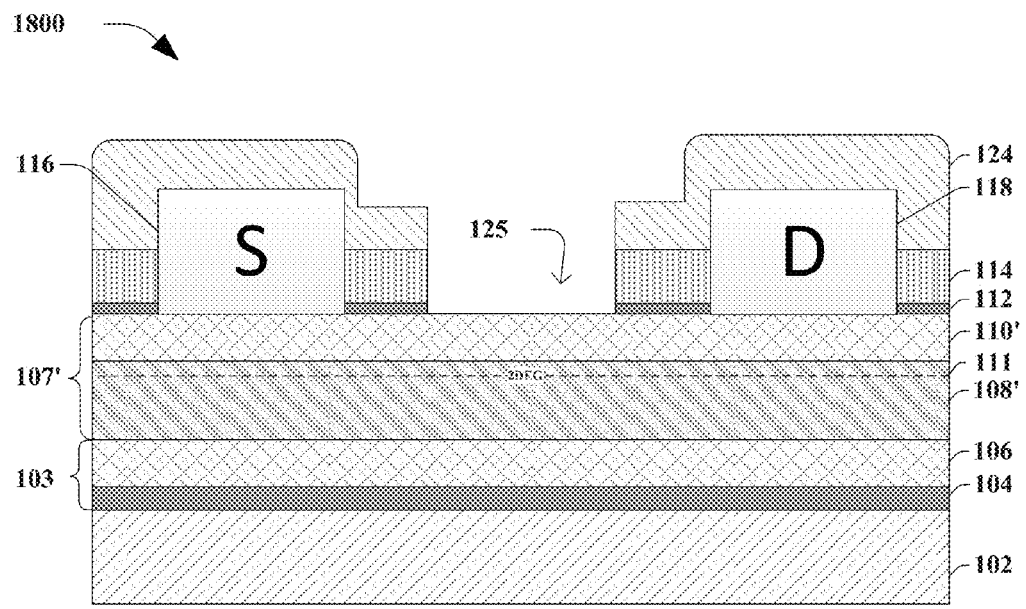

FIG. 18 illustrates a cross-sectional view of a semiconductor structure 1800 corresponding to Act 1416 of FIG. 14. As illustrated in FIG. 18, an opening 125 is formed through the capping layer material 124, the bulk passivation layer material 114 and the interfacial layer material 112, at a lateral position between the source and drain regions 116, 118 respectively, to form the interfacial layer 112, the bulk passivation layer 114 and the capping layer 124. In various embodiments, the opening 125 may be formed using a dry etchant (e.g., an RIE etch, a plasma etch, etc.) or a wet etchant (e.g., hydroflouric acid).

Figure 19:
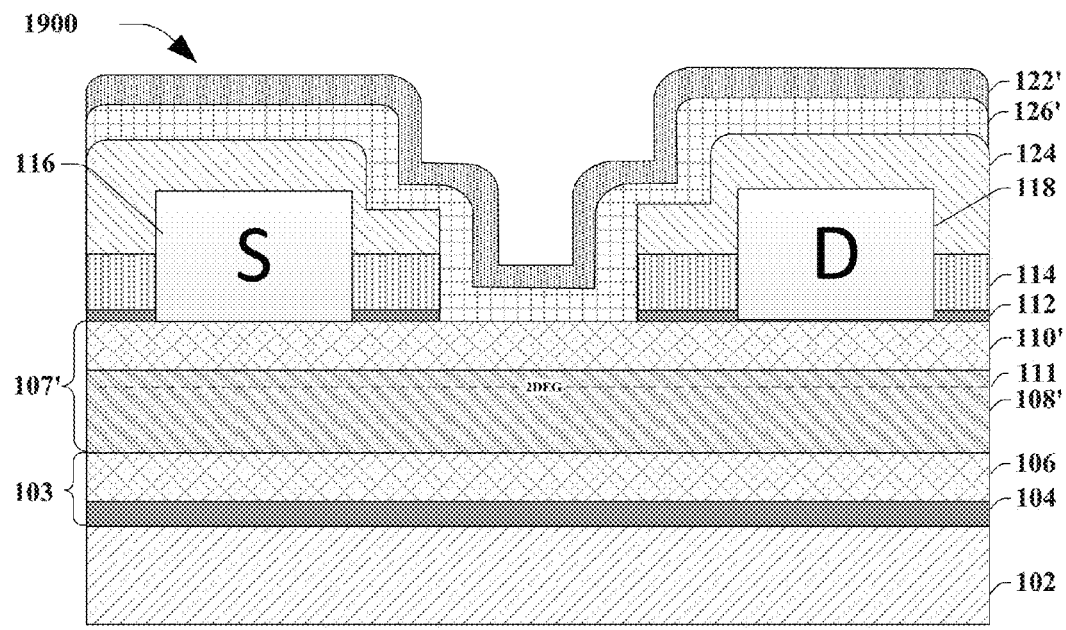

FIG. 19 illustrates a cross-sectional view of a semiconductor structure 1900 corresponding to Act 1418 of FIG. 14. As illustrated in FIG. 19, an insulator layer 126' is formed over the capping layer 124 and within the opening 125, so that the insulator layer 126' abuts a top surface of the barrier layer 110' within the opening 125. In some embodiments, the insulator layer 126' may comprise a SiN layer, an aluminum oxide ($AlO_3$ or $Al_2O_3$) layer, a hafnium oxide layer ($HfO_2$), or a $SiO_2$ layer. A gate electrode layer 122' is conformally formed over the insulator layer 126'. In some embodiments, the gate electrode layer 122' comprises metals like Ti, Al, Ni, Au or a combination of such metals.

Figure 20:
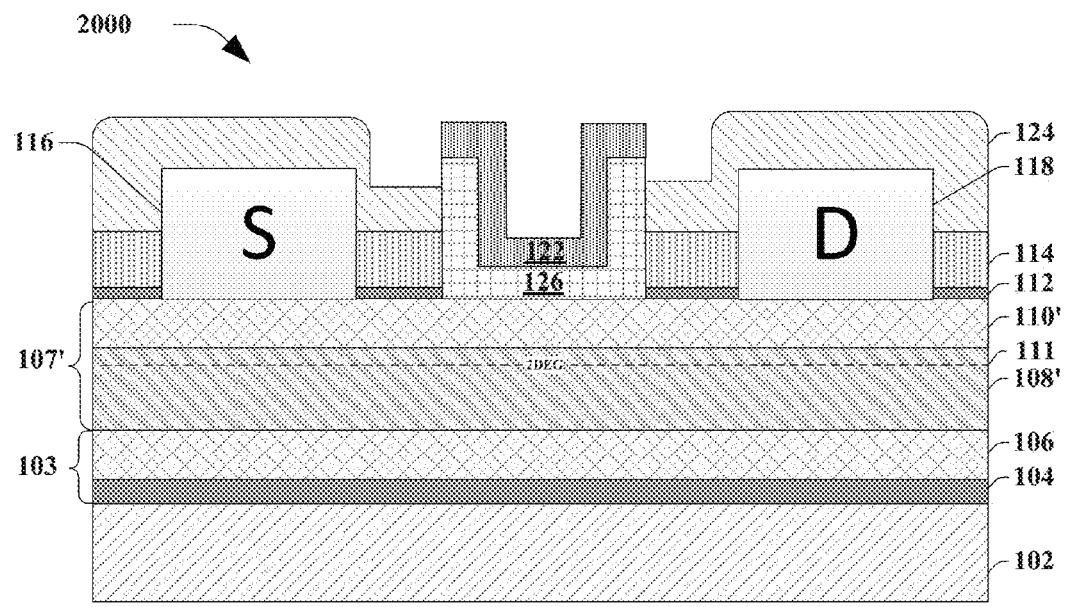

FIG. 20 illustrates a cross-sectional view of a semiconductor structure 2000 corresponding to Act 1420 of FIG. 14. As illustrated in FIG. 20, the gate electrode layer 122' and the insulator layer 126' are etched to form a gate insulator 126 and a gate electrode 122 disposed within the gate insulator 126. In various embodiments, the gate electrode layer 122' and the insulator layer 126' may be etched using a dry etchant (e.g., an RIE etch, a plasma etch, etc.) or a wet etchant (e.g., hydroflouric acid).

The present disclosure relates to a structure and method of a III-V HEMT device, that includes an interfacial layer of III-V material disposed between a bulk passivation layer and a heterojunction structure of the HEMT device.

In some embodiments, the present disclosure relates to a semiconductor device comprising, a substrate, a bulk buffer layer disposed over the substrate, a device layer of III-V material disposed over the bulk buffer layer, a source region, a drain region and a gate region located laterally between the source and drain regions, and wherein the gate region comprises a gate electrode overlying a gate separation layer, a bulk passivation layer arranged over the device layer, and an interfacial layer of III-V material disposed between the bulk passivation layer and the device layer, wherein the source region, the drain region and the gate region extend through the bulk passivation layer and the interfacial layer, to abut the device layer.

In another embodiment, the present disclosure relates to a method of forming a group III-V semiconductor device comprising, providing a substrate, forming a buffer layer over the substrate, forming a heterojunction structure of III-V materials over the buffer layer, forming an interfacial layer of III-V material over the heterojunction structure, forming a bulk passivation layer over the interfacial layer, forming source and drain regions over the heterojunction structure, and forming a capping layer over the source and drain regions and the bulk passivation layer, and forming a gate region between the source and drain regions, wherein the source, the drain and the gate regions extend through the bulk passivation layer and the interfacial layer, to abut an upper surface of the heterojunction structure.

In yet another embodiment, the present disclosure relates to a group III-V semiconductor device comprising, an aluminum nitride (AlN) buffer layer disposed over a silicon (Si) substrate, an aluminum gallium nitride (AlGaN) buffer layer disposed over the AlN buffer layer, a gallium nitride (GaN) channel layer disposed over the AlGaN buffer layer, an AlGaN barrier layer disposed over the GaN channel layer, an AlN interfacial layer disposed over the AlGaN barrier layer, a bulk oxide passivation layer disposed over the AlN buffer layer, and a gate region laterally disposed between source and drain regions, wherein the source, drain and gate regions extend through the AlN interfacial layer and the bulk oxide passivation layer to abut the AlGaN barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A group III-V semiconductor device comprising:
    a substrate;
    a bulk buffer layer disposed over the substrate;
    a device layer of III-V material disposed over the bulk buffer layer;
    a source region, a drain region and a gate region located laterally between the source and drain regions, and wherein the gate region comprises a gate electrode overlying a gate separation layer and wherein the gate separation layer comprises a doped III-V material layer or an insulator;
    a bulk passivation layer arranged over the device layer; and
    an interfacial layer of III-V material contacting the bulk passivation layer and the device layer, wherein the source region, the drain region and the gate region extend through the bulk passivation layer and the interfacial layer, to contact the device layer; and
    a capping layer disposed over the bulk passivation layer, the source region and the drain region, wherein the gate region extends over an upper surface of the capping layer.

2. The semiconductor device of claim 1, wherein:
    the bulk passivation layer comprises silicon oxide (SiOx), silicon oxynitride (SiONx), or aluminum oxide (Al2O3), where x ranges from approximately 1.6 to approximately 2.1; and
    the interfacial layer comprises aluminum nitride (AlN), boron nitride (BN) or an aluminum boron nitrogen alloy (AlxB1-xN), where x ranges from approximately 0.25 to approximately 0.75.

3. The semiconductor device of claim 1, wherein the gate region is disposed within a recess within the interfacial layer, the bulk passivation layer and the capping layer, and wherein the gate electrode laterally contacts the interfacial layer and the bulk passivation layer.

4. The semiconductor device of claim 1, wherein the device layer of III-V material comprises:
    a first III-V device sub-layer having a first bandgap; and
    a second III-V device sub-layer having a second bandgap that differs from the first bandgap, wherein the first and second III-V device sub-layers abut at a heterojunction interface.

5. The semiconductor device of claim 4, wherein:
    the substrate comprises SiC (silicon carbide), Si (silicon) or sapphire;
    the first III-V device sub-layer comprises GaN (gallium nitride);
    the second III-V device sub-layer comprises AlGaN (aluminum gallium nitride);
    the capping layer comprises SiN (silicon nitride) or SiO2 (silicon dioxide); and
    the insulator comprises SiN.

6. The semiconductor device of claim 1,
    wherein a thickness of the interfacial layer, ranges from approximately 5 Angstrom to approximately 500 Angstrom; and
    wherein a thickness of the bulk passivation layer, ranges from approximately 30 nm to approximately 500 nm.

7. The semiconductor device of claim 1, wherein the bulk buffer layer comprises:
    an AlN buffer layer disposed over the substrate; and
    an aluminum gallium nitride (AlGaN) buffer layer disposed over the AlN buffer layer.

8. The semiconductor device of claim 1, wherein the gate electrode has a width that is greater than or equal to a width of the gate separation layer.

9. The semiconductor device of claim 1, wherein the interfacial layer and the bulk passivation layer have outer sidewalls facing the gate region that are aligned.

10. A method of forming a group III-V semiconductor device comprising:
    providing a substrate;
    forming a bulk buffer layer over the substrate;
    forming a heterojunction structure of III-V materials over the bulk buffer layer;
    forming an interfacial layer of III-V material over the heterojunction structure;
    forming a bulk passivation layer contacting the interfacial layer;
    forming source and drain regions over the heterojunction structure; and
    forming a capping layer over the source and drain regions and the bulk passivation layer; and
    forming a gate region, comprising a gate electrode overlying a gate separation layer, between the source and drain regions, wherein the source, the drain and the gate regions extend through the bulk passivation layer and the interfacial layer, to contact an upper surface of the heterojunction structure.

11. The method of claim 10, wherein the bulk passivation layer comprises a silicon oxide layer formed by a plasma enhanced chemical vapor deposition (PECVD) process performed within a processing chamber held at a temperature in a range of between approximately 300° C. and approximately 550° C.

12. The method of claim 11, wherein the heterojunction structure comprises a III-V channel layer abutting a barrier layer which is different from the III-V channel layer.

13. The method of claim 12, wherein the III-V channel layer has a bandgap which is less than a band gap of the barrier layer.

14. The method of claim 12, wherein forming the gate region comprises:
   forming the gate separation layer as a doped III-V material layer having a bottom surface that abuts the barrier layer prior to formation of the interfacial layer, wherein outer sidewalls of the doped III-V material layer abut the interfacial layer;
   forming an opening through the interfacial layer, the bulk passivation layer and the capping layer, at a lateral position between the source and drain regions; and
   forming the gate electrode within the opening and abutting a top surface of the doped III-V material layer.

15. The method of claim 12, wherein forming the gate region comprises:
   forming an opening through the interfacial layer, the bulk passivation layer and the capping layer, at a lateral position between the source and drain regions;
   forming an insulator within the opening and abutting the barrier layer; and
   forming the gate electrode within the opening and over the capping layer, wherein the gate electrode laterally contacts the interfacial layer and the bulk passivation layer.

16. A group III-V semiconductor device comprising:
   an aluminum nitride (AlN) buffer layer disposed over a silicon (Si) substrate;
   an aluminum gallium nitride (AlGaN) buffer layer disposed over the AlN buffer layer;
   a gallium nitride (GaN) channel layer disposed over the AlGaN buffer layer;
   an AlGaN barrier layer disposed over the GaN channel layer;
   an AlN interfacial layer disposed over the AlGaN barrier layer and arranged along opposing sides of a source region and opposing sides of a drain region;
   a bulk oxide passivation layer disposed over the AlN buffer layer;
   a gate region, comprising a gate electrode and a gate separation layer, laterally disposed between the source and drain regions, wherein the source, drain and gate regions extend through the AlN interfacial layer and the bulk oxide passivation layer to abut the AlGaN barrier layer;
   a capping layer disposed over the bulk oxide passivation layer, the source and the drain regions, wherein the gate region extends over an upper surface of the capping layer; and
   a recess within the capping layer, the bulk oxide passivation layer, and the AlN interfacial layer, wherein the gate electrode is disposed within the recess and laterally contacts the interfacial layer and the bulk oxide passivation layer.

17. The semiconductor device of claim 16, wherein the gate separation layer comprises a doped GaN layer residing below the gate electrode and abutting the AlGaN barrier layer.

* * * * *